US009608671B2

(12) United States Patent
Yu (10) Patent No.: US 9,608,671 B2
(45) Date of Patent: Mar. 28, 2017

(54) ERROR DETECTION METHOD OF VARIABLE-LENGTH CODING CODE STREAM AND DECODING AND ERROR DETECTION APPARATUS

(71) Applicant: AutoChips Inc., Hefei, Anhui Province (CN)

(72) Inventor: Jingjian Yu, Hefei (CN)

(73) Assignee: AUTOCHIPS INC., Hefei, Anhui Province (CN)

( * ) Notice: Subject to any disclaimer, the term of this patent is extended or adjusted under 35 U.S.C. 154(b) by 118 days.

(21) Appl. No.: 14/265,346

(22) Filed: Apr. 29, 2014

(65) Prior Publication Data

US 2014/0337692 A1 Nov. 13, 2014

(30) Foreign Application Priority Data

May 13, 2013 (CN) .......................... 2013 1 0176084

(51) Int. Cl.
*H03M 13/00* (2006.01)
*H03M 7/46* (2006.01)
*H03M 7/30* (2006.01)

(52) U.S. Cl.
CPC ......... *H03M 13/6318* (2013.01); *H03M 7/46* (2013.01); *H03M 7/6041* (2013.01); *H03M 13/6312* (2013.01)

(58) Field of Classification Search
CPC .. H03M 7/46; H03M 7/6041; H03M 13/6312; H03M 13/6318
See application file for complete search history.

(56) References Cited

U.S. PATENT DOCUMENTS

| | | | | |
|---|---|---|---|---|
| 5,603,012 A * | 2/1997 | Sotheran | ............... | G06F 9/3867 370/450 |
| 5,724,537 A * | 3/1998 | Jones | ................... | G06F 12/0207 375/E7.094 |
| 5,768,561 A * | 6/1998 | Wise | ......................... | G06F 3/14 709/221 |
| 5,805,914 A * | 9/1998 | Wise | ....................... | G06F 15/00 382/232 |
| 5,809,270 A * | 9/1998 | Robbins | ................ | G06F 9/3867 375/E7.093 |
| 5,835,740 A * | 11/1998 | Wise | ...................... | G06F 9/3867 375/E7.093 |
| 6,018,776 A * | 1/2000 | Wise | ...................... | G06F 9/3867 375/E7.093 |
| 6,067,417 A * | 5/2000 | Wise | ..................... | G06F 9/3867 375/E7.093 |

(Continued)

FOREIGN PATENT DOCUMENTS

CN 102349272 A 2/2012

Primary Examiner — Albert Decady
Assistant Examiner — Kyle Vallecillo
(74) Attorney, Agent, or Firm — Cheng-Ju Chiang (57) ABSTRACT

An error detection method of a variable-length coding (VLC) code stream includes at least the following steps: decoding a data frame of the VLC code stream; and determining whether the data frame is erroneous according to length information of the data frame and a bit number of decoded data of the data frame. According to the method, the present invention realizes the objective of performing error detection upon data frames during the decoding process.

12 Claims, 8 Drawing Sheets

(56) References Cited

U.S. PATENT DOCUMENTS

| | | | | |
|---|---|---|---|---|
| 6,079,009 A * | 6/2000 | Wise | ............... | G06F 9/3867 |
| | | | | 375/E7.093 |
| 6,112,017 A * | 8/2000 | Wise | ............... | G06F 9/3867 |
| | | | | 375/E7.093 |
| 6,208,274 B1 * | 3/2001 | Taori | ............... | H03M 7/42 |
| | | | | 341/67 |
| 6,330,665 B1 * | 12/2001 | Wise | ............... | G06F 9/3867 |
| | | | | 375/E7.093 |
| 6,404,817 B1 * | 6/2002 | Saha | ............... | H04N 19/895 |
| | | | | 348/425.2 |
| 2003/0156652 A1 * | 8/2003 | Wise | ............... | G06F 9/3867 |
| | | | | 375/240.26 |
| 2010/0289674 A1 * | 11/2010 | Shigenobu | ............... | G10L 19/167 |
| | | | | 341/67 |
| 2012/0005562 A1 | 1/2012 | Morie et al. | | |

* cited by examiner

ERROR DETECTION METHOD OF VARIABLE-LENGTH CODING CODE STREAM AND DECODING AND ERROR DETECTION APPARATUS

BACKGROUND

The disclosed embodiments of the present invention relate to audio signal processing, and more particularly, to an error detection method of a variable-length coding code stream and a related decoding and error detection apparatus.

The Variable-Length Coding (VLC) is a coding method which performs coding upon data by using codewords with various lengths. Specifically speaking, the VLC employs shorter codewords to encode data with higher occurrence probability, and employs longer codewords to encode data with lower occurrence probability. The overall encoding efficiency is improved accordingly. Since lengths of the codewords employed by the VLC are not fixed, the exact data amount required to be decoded is unknown before the decoding process is completed. Conventionally, decoding a data frame may need to look up a coding table based on a codeword, thereby restoring an initial value corresponding to the codeword. By referring to the coding table, information, such as length range of a codeword and the correspondence between the codeword and the initial value, can be obtained. However, if bit reversing or other transmission errors happen to the data of a code stream during transmission, the data amount read by the decoder may be affected, resulting in that the decoded code stream differs from the original code stream.

Specifically, the VLC includes Huffman coding, Shannon-Fano algorithm, Exponential-Golomb coding, etc. Taking the Huffman coding for example, suppose the intraframe source symbols of the original code stream required to be transmitted are a1, a5, a7, a1, a3 and a4, the original code stream 10, 010, 0111, 10, 000 and 001 can be derived by encoding the source symbols according to the correspondence between the source symbols and the codewords in a Huffman coding table (Table 1).

TABLE 1

| source symbol $a_i$ | Probability $p(a_i)$ | Huffman codeword $W_i$ | codeword length $K_i$ |
| --- | --- | --- | --- |
| $a_1$ | 0.20 | 10 | 2 |
| $a_2$ | 0.19 | 11 | 2 |
| $a_3$ | 0.18 | 000 | 3 |
| $a_4$ | 0.17 | 001 | 3 |
| $a_5$ | 0.15 | 010 | 3 |
| $a_6$ | 0.10 | 0110 | 4 |
| $a_7$ | 0.01 | 0111 | 4 |

During the transmission, errors may occur due to channel instability or other reasons, thus resulting in variation of the received code stream. Assuming that the code stream received by the receiving end is composed of 10, 011, 0111, 10, 000 and 001, when decoding the received code stream, the receiving end firstly reads the codeword "10" and derives a corresponding decoded source symbol as a1. Then the receiving end reads the codeword "011", while no corresponding source symbol can be found in Table 1. Therefore, the receiving end will falsely employ the following bit "0" as part of the present codeword (i.e. the read codeword will be "0110"), and derive a corresponding decoded source symbol as a6. The decoding process continues by sequentially reading the code stream. After 6 codewords are decoded, the derived source symbols are a1, a6, a2, a2, a3 and a3 respectively, while the last bit of the received code stream "1" is unused. Said scenario is an example of how an erroneous decoding takes place, that is, the amount of used (read) data is less than it should be. Besides, the decoded code stream mismatches the original code stream.

Further, assuming that the received code stream is composed of 10, 011, 0011, 10, 000 and 001, the source symbols corresponding to the first 5 codewords are a1, a6, a7, a3 and a3, respectively. The original code stream transmitted from the encoder including 6 codewords; however, only 1 bit "1" is left after the first 5 codewords are decoded based on the received code stream. As the shortest bit-length of the Huffman codeword shown in Table 1 is 2, the decoder of the receiving end therefore needs to take at least 1 bit from the data frame immediately following the present data frame in combination with the remaining 1 bit of the present frame for completing the decoding process of the sixth codeword. Meanwhile, another erroneous situation takes place, that is, the amount of used (read) data is more than it should be. Besides, the decoded code stream mismatches the original code stream.

On the other hand, if the coding table changes in the course of decoding the received code stream, it will lead to mismatch between the decoded code stream and the original code stream.

In practice, the VLC may be applied to various audio formats such as Advanced Audio Coding (AAC), Moving Picture Experts Group Audio Layer III (MP3), Free Lossless Audio Codec (FLAC), etc. There are reasons (e.g. instability of the transmission channel) that may result in erroneous code stream. Further, erroneous storing process of the coding table may result in decoding error of the data frames of the code stream. Both might lead to discontinuity of sound, bursts, or even a system crash.

In order to solve the aforementioned issues, one conventional solution is to add a Cyclic Redundancy Check (CRC) code to the code stream during encoding, and perform a CRC check upon the data frame for detecting whether the data frame contains error bits after the data frame is completely decoded. However, said conventional solution does not detect error until the completion of data frame decoding process, and thus cannot obtain an error detection result during the decoding process. As a result, said conventional solution has disadvantages on the aspect of preventing the normal system operation from being affected by data frame errors.

SUMMARY

In light of the above mentioned issues, the present invention therefore discloses an error detection method of a variable-length coding code stream and a decoding and error detection apparatus.

According to an embodiment of the present invention, an error detection method of Variable-Length Coding (VLC) code stream is disclosed, the method comprises: decoding a data frame of the code stream; and determining whether the data frame is erroneous according to length information and bit number of decoded data of the data frame.

According to another embodiment of the present invention, an error detection method of Variable-Length Coding (VLC) code stream is disclosed, the method comprises: decoding a data frame of the code stream according to a coding table; and determining whether the data frame is erroneous according to the coding table and currently fetched bit number.

According to yet another embodiment of the present invention, a decoding and error detection apparatus is disclosed, the apparatus comprises: a first determining module, coupled to the decoding module; and an error handling module, coupling to the first determining module, wherein after the decoding module decoding a data frame of the code stream, the first determining module determines whether the data frame is erroneous according to length information and bit number of decoded data of the data frame, and when the first determining module determines the data frame is erroneous, the error handling module performs error handling process upon the data frame.

According to still yet another embodiment of the present invention, a decoding and error detection apparatus is disclosed, the apparatus comprises: a decoding module; a first determining module, coupled to the decoding module; and an error handling module, coupled to the first determining module, wherein after the decoding module decodes a data frame of the code stream according to a coding table, the first determining module determines whether the data frame is erroneous according to the coding table and currently fetched bit number, when the first determining module determines the data frame is erroneous, the error handling module performs error handling process upon the data frame.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
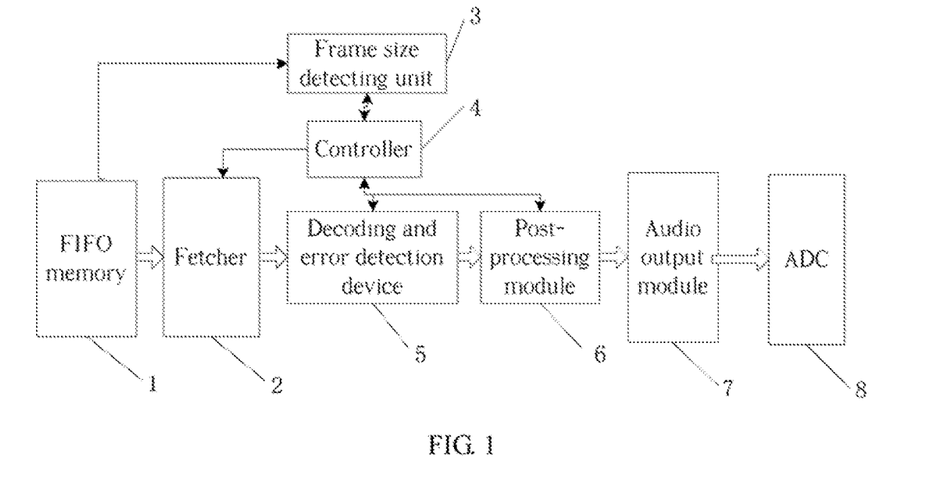
FIG. 1 is a diagram illustrating a structure of an embedded audio decoder according to an embodiment of the present invention.

Please refer to FIG. 1, which is a diagram illustrating a structure of an embedded audio decoder according to an embodiment of the present invention. As shown in FIG. 1, the embedded audio decoder includes an asynchronous first-in first-out (FIFO) memory 1, a fetcher 2, a frame size detecting unit 3, a controller 4, a decoding and error detection device 5, a post-processing module 6, an audio output module 7 and an analog-to-digital converter (ADC) 8.

The asynchronous FIFO memory 1 is used for buffering the continuous code stream to be decoded. The fetcher 2 is coupled to the asynchronous FIFO memory 1, and is used to fetch the code stream to be decoded from the asynchronous FIFO memory 1. In an embedded system, the fetching process may be performed by either a hardware circuit or a software manner. The present invention is not limited to either way.

The frame size detecting unit 3 is coupled to the asynchronous FIFO memory 1, and is used for examining whether the length of data buffered in the asynchronous FIFO memory 1 is at least enough for the current decoding. For example, when decoding the AAC frame header of the AAC data frame, where the AAC frame header length is fixed to 7 bytes, the frame size detecting unit 3 detects whether there is at least 7 bytes of data buffered in the asynchronous FIFO memory 1.

In this embodiment, the fetcher 2 is implemented by a hardware circuit. As realizing the buffer error protection function requires to increase the circuit area and adopt a more complicated design, which dramatically increases the cost, the hardware-based fetching circuit is usually implemented without the buffer error protection function. The frame size detecting unit 3 can effectively avoid the hardware fetching circuit from making mistakes. Accordingly, in this embodiment, the fetcher 2 acknowledges whether the asynchronous FIFO memory 1 preserves enough data buffered therein through the frame size detecting unit 3 before fetching data. In this way, correctness of the fetching operation performed by the fetcher 2 is guaranteed. The controller 4 is coupled to the frame size detecting unit 3, the decoding and error detection device 5, and post-processing module 6, and is used for controlling and coordinating the overall audio decoding process. When the frame size detecting unit 3 detects that the length of data buffered in the asynchronous FIFO memory 1 is enough for the current decoding, the controller 4 controls the fetcher 2 to fetch data from the asynchronous FIFO memory 1 and forward the fetched data to the decoding and error detection device 5 to decode and error detect. After the decoding and error detection process is completed, the controller 4 controls the decoding and error detection device 5 to transmit the decoded code stream to the post-processing module 6 for further processing, thereby recovering the original audio data.

The decoding and error detection device 5 is coupled to the fetcher 2 and the post-processing module 6, and is used for decoding data frames of the code stream and performing error detection upon the data frames according to the length information of the data frames and the bit number of the decoded data. The length information of the data frames may be derived from the information provided by the headers of the data frames or the specification of the data frames, or derived from other information transmitted to the decoder.

Taking the AAC decoding for example, after the decoding and error detection device 5 obtains data bits from the asynchronous FIFO memory 1 through fetcher 2, the scaling factor or frequency spectrum information can be decoded by referring to a lookup table (e.g. a binary tree search). During the decoding process, the decoding and error detection device 5 further determines whether the data frame is erroneous. If any error is detected, the error handling process will be performed.

The post-processing module 6 is coupled to the decoding and error detection device 5 and the audio output module 7, and is arranged for receiving the decoded code stream, performing post-processing upon the decoded code stream, and outputting the post-processed data to the audio output module 7. Taking the AAC decoding for example, the post-processing module 6 performs de-quantization, scaling, prediction, sound intensity/coupling, transient noise shaping, filtering and gain control upon the decoded scaling factor or frequency spectrum information, so as to derive the pulse-code modulation (PCM) audio information. As those persons skilled in the art readily understand details of the post-processing module 6, further description is omitted here for brevity.

The audio output module 7 is coupled to the post-processing module 6 and the ADC 8, and is used to receive the processed data, where the processed data is converted to analog signals via the DAC 8, and then outputted to a speaker (not shown in the figure).

Figure 2:
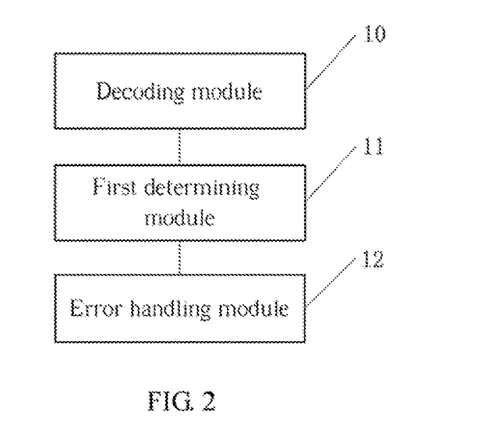
FIG. 2 is a diagram illustrating a structure of the decoding and error detection device shown in FIG. 1 according to a first embodiment of the present invention.

Please refer to FIG. 2, which is a diagram illustrating a structure of the decoding and error detection device 5 shown in FIG. 1 according to a first embodiment of the present invention. As shown in FIG. 2, the decoding and error detection device 5 includes a decoding module 10, a first determining module 11 and an error handling module 12.

The decoding module 10 is coupled to the fetcher 2 and the post-processing module 6, and is used for decoding data frames of the code stream fetched by the fetcher 2, and further transmitting the decoded data to the post-processing module 6. The first determining module 11 is coupled to the decoding module 10. In the course of decoding the data frames in the code stream, the first determining module 11 determines whether the data frames are erroneous according to the length information of the data frames and the bit number of the decoded data. The error handling module 12 is coupled to the first determining module 11. If any error is detected by the first determining module 11, the error handling process will be performed upon the data frames.

Figure 3:
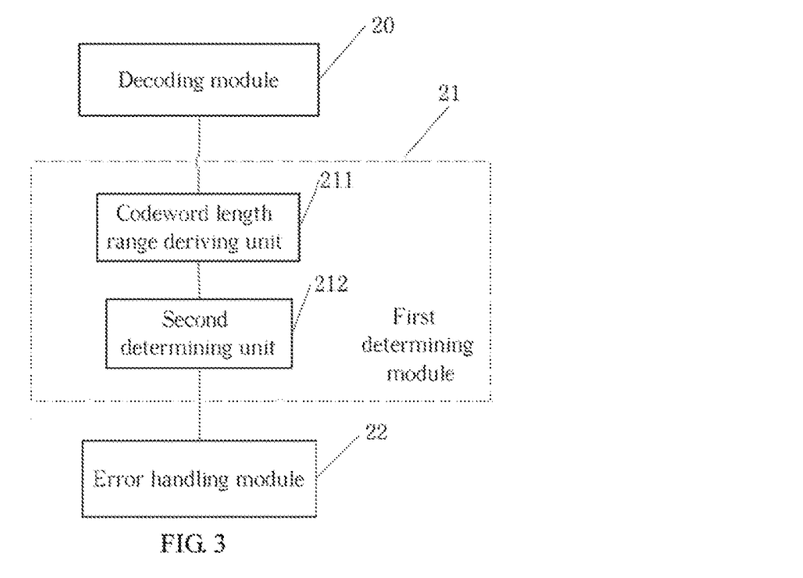
FIG. 3 is a diagram illustrating a structure of the decoding and error detection device shown in FIG. 1 according to a second embodiment of the present invention.

Please refer to FIG. 3, which is a diagram illustrating a structure of the decoding and error detection device shown in FIG. 1 according to a second embodiment of the present invention. As shown in FIG. 3, the decoding and error detection device 5 includes a decoding module 20, a first determining module 21 and an error handling module 22, wherein the first determining module 21 includes a codeword length range deriving unit 211 and a second determining unit 212.

As the decoding module 20 and the error handling module 22 are similar to the decoding module 10 and the error handling module 12 of the first embodiment in FIG. 2, the details are omitted here for brevity.

When the decoding module 20 decodes the data frame according to the coding tables, the first determining module 21 determines whether the data frame is erroneous according to the coding tables and the bit number of currently fetched data.

Specifically speaking, the codeword length range deriving unit 211 is coupled to the decoding module 20, and is used for referring the coding tables to obtain the range of codeword lengths of codewords corresponding to the currently fetched bit number. The second determining unit 212 is coupled to the codeword length range deriving unit 211, and is used for determining whether the currently fetched bit number is within the range of codeword lengths after obtaining the codeword length range from the codeword length range deriving unit 211. When the second determining unit 212 determines the currently fetched bit number is out of the codeword length range, the error handling process will be performed by the error handling module 22.

Figure 4:
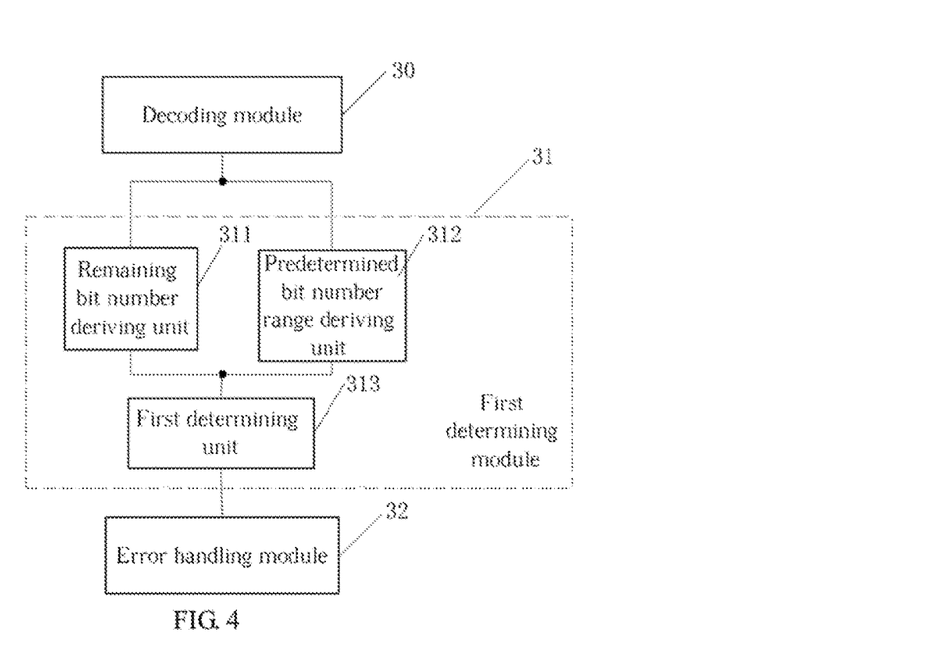
FIG. 4 is a diagram illustrating a structure of the decoding and error detection device shown in FIG. 1 according to a third embodiment of the present invention.

Please refer to FIG. 4, which is a diagram illustrating a structure of the decoding and error detection device shown in FIG. 1 according to a third embodiment of the present invention. As shown in FIG. 4, the decoding and error detection device 5 includes a decoding module 30, a first determining module 31 and an error handling module 32, wherein the first determining module 31 includes a remaining bit number deriving unit 311, a predetermined bit number range deriving unit 312 and a first determining unit 313.

As the decoding module 30 and the error handling module 32 are similar to the decoding module 10 and the error handling module 12 of the first embodiment in FIG. 2, the details are omitted here for brevity.

When the decoding module 30 decodes the data frame according to the coding tables, the first determining module 31 determines whether the data frame is erroneous by referring to the length information to check whether the accumulated fetched bit number is within a length range of the data frame.

Specifically speaking, the remaining bit number deriving unit 311 is coupled to the decoding module 30, and is arranged for obtaining bit number of remaining un-decoded data of the data frame according to the accumulated fetched bit number. The remaining bit number deriving unit 311 obtains the bit number of the remaining un-decoded data of the data frame according to the length information and the accumulated fetched bit number, wherein the remaining bit number corresponds to the difference between the length of the data frame and the accumulated fetched bit number.

The predetermined bit number range deriving unit 312 is coupled to the decoding module 30, and is used for referring to the coding tables to obtain a range of predetermined bit number of data corresponding to codewords of the un-decoded data of the data frame. Specifically speaking, the predetermined bit number range deriving unit 312 obtains ranges of codeword lengths in the coding tables that are used by the codewords of the un-decoded data of the data frame, respectively, and then obtains the range of the predetermined bit number of the data corresponding to the codewords of the un-decoded data of the data frame according to the ranges of codeword lengths in the coding tables that are used by the codewords of the un-decoded data, wherein the range of the predetermined bit number of the data corresponds to an accumulated summing number of the ranges of codeword lengths in the coding tables that are used by the codewords of the un-decoded data.

The first determining unit 313 is coupled to the remaining bit number deriving unit 311 and the predetermined bit number range deriving unit 312, and is used for obtaining the bit number of the remaining data from the remaining bit number deriving unit 311 and obtaining the range of the predetermined bit number from the predetermined bit number range deriving unit 312, and determining whether the bit number of the remaining un-decoded data is within the range of the predetermined bit number of data, wherein when the first determining unit 313 determines that the bit number of the remaining un-decoded data is not within the range of the predetermined bit number of data, the error handling module 32 will perform error handling process upon the data frame.

Figure 5:
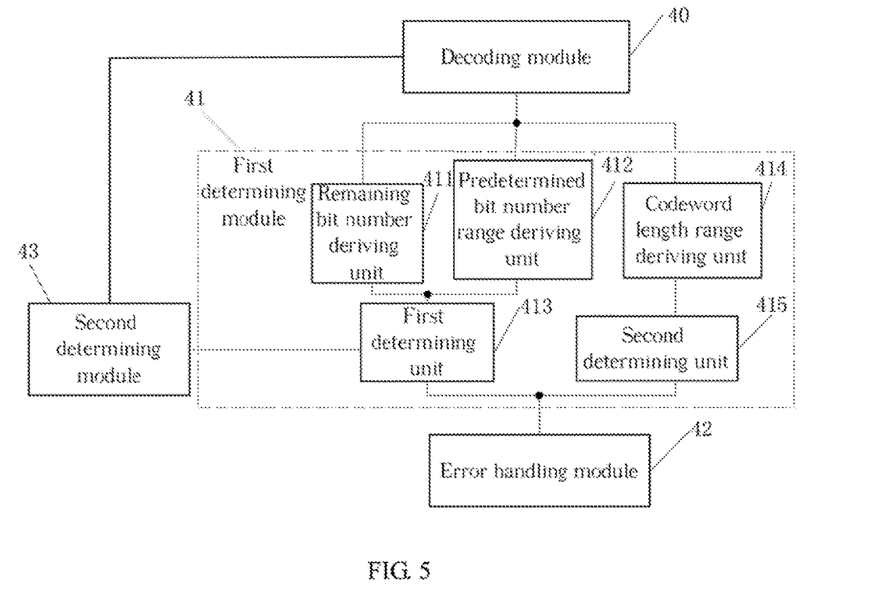
FIG. 5 is a diagram illustrating a structure of the decoding and error detection device shown in FIG. 1 according to a fourth embodiment of the present invention.

Please refer to FIG. 5, which is a diagram illustrating a structure of the decoding and error detection device shown in FIG. 1 according to a fourth embodiment of the present invention. As shown in FIG. 5, the decoding and error detection device 5 includes a decoding module 40, a first determining module 41, an error handling module 42 and a second determining module 43.

As the decoding module 40 and the error handling module 42 are similar to the decoding module 10 and the error handling module 12 of the first embodiment in FIG. 2 respectively, the details are omitted here for brevity.

When the decoding module 40 decodes the data frame according to the coding tables, the first determining module 41 determines whether the data frame is erroneous by determining whether the accumulated bit number is within the length range of the data frame according to the length information and determining whether the currently fetched bit number is within the codeword length range.

Specifically speaking, the first determining module 41 includes a remaining bit number deriving unit 411, a predetermined bit number range deriving unit 412, a first determining unit 413, a codeword length range deriving unit 414 and a second determining unit 415.

As the remaining bit number deriving unit 411, the predetermined bit number range deriving unit 412, the first determining unit 413 are similar to the remaining bit number deriving unit 311, the predetermined bit number range deriving unit 312, the first determining unit 313 shown in FIG. 4, and the codeword length range deriving unit 414 and the second determining unit 415 are similar to the codeword length range deriving unit 211 and the second determining unit 212 shown in FIG. 3, the details are omitted here for brevity.

Furthermore, the second determining module 43 is coupled to the first determining unit 413 and the decoding module 40. When the first determining unit 413 determines that the bit number of the remaining un-decoded data is within the range of the predetermined bit number of data, the second determining module 43 will further determine whether all of the codewords of the data frame are completely decoded. If the second determining module 43 determines that not all the codewords of the data frame are completely decoded yet, the decoding module 40 goes on decoding codewords of the current data frame according to the coding tables. If the second determining module 43 determines that all codewords of the data frame are completely decoded, the decoding module 40 goes on to decode the next data frame in the code stream according to the coding tables.

Figure 6:
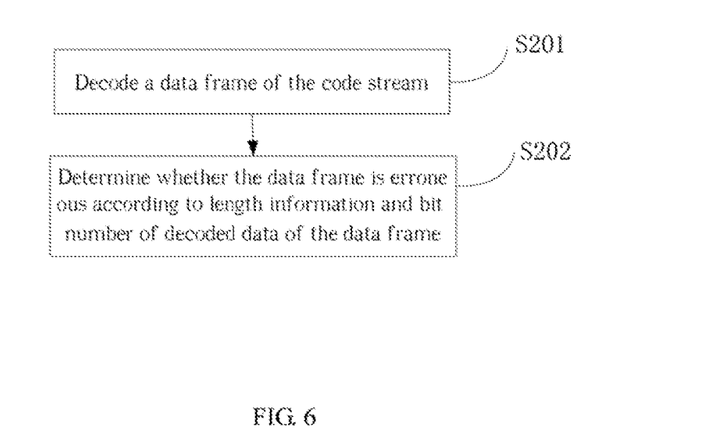
FIG. 6 is a flowchart illustrating an error detection method of a VLC code stream according to a first embodiment of the present invention.

FIG. 6 is a flowchart illustrating an error detection method of a VLC code stream according to a first embodiment of the present invention. Provided that substantially the same result is achieved, the steps of the flowchart shown in FIG. 6 need not be in the exact order shown and need not be contiguous. The method shown in FIG. 6 may be briefly summarized as follows.

Step S201: Decode a data frame of the code stream;
Step S202: Determine whether the data frame is erroneous according to length information and bit number of decoded data of the data frame.

In step S201, the code stream may comply with one of various audio formats, including AAC, MP3, APE, FLAC, APLC and other VLC formats. The code stream is composed of data frames for carrying the encoded audio data, and the data frames are decoded to recover the audio data in the code stream.

In step S202, the length information of the data frames may be derived from the information provided by the headers of the data frames or the specification of the data frames, or may be derived from other information transmitted to the decoder. The bit number of the decoded data is the bit number of the decoded frame data of the data frame. The decoder can determine whether decoding error of the data frames occurs according to the length information of the data frame and the bit number of the decoded data, and performs a corresponding error handling process when decoding error of the data frames occurs.

By employing the aforementioned method, the error detection method of the VLC code stream determines whether errors occurs in data frames on the basis of length information of the data frames and bit number of the decoded data according to the first embodiment of the present invention. Therefore, the objective of obtaining error detection results of the data frames before Cyclic Redundancy Check (CRC) process to thereby prevent the normal system operation from being affected by data frame errors is achieved. Specifically speaking, the aforementioned method avoids discontinuity of sound, bursts, or even a system crash caused by decoding error of the data frames.

Figure 7:
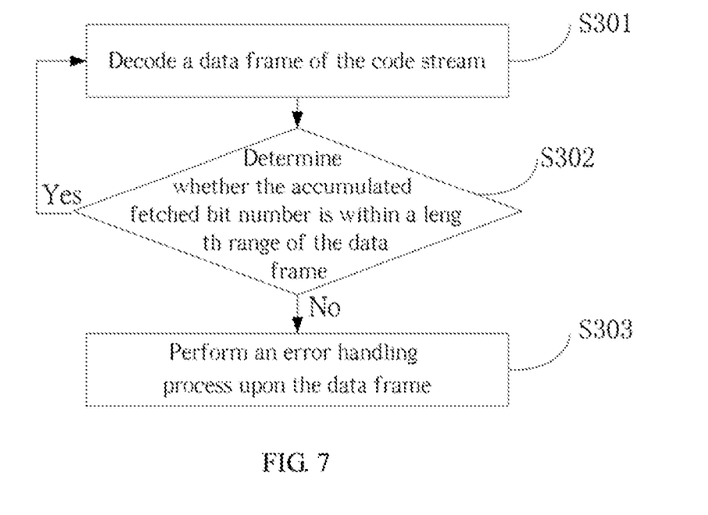
FIG. 7 is a flowchart illustrating an error detection method of a VLC code stream according to a second embodiment of the present invention.

FIG. 7 is a flowchart illustrating an error detection method of a VLC code stream according to a second embodiment of the present invention. Provided that substantially the same result is achieved, the steps of the flowchart shown in FIG. 7 need not be in the exact order shown and need not be contiguous. The method shown in FIG. 7 may be briefly summarized as follows.

Step S301: Decode a data frame of the code stream.
In this embodiment, step S301 is similar to step S201 of FIG. 6, and the details are omitted here for brevity.

Step S302: Determine whether the accumulated fetched bit number is within a length range of the data frame. If yes, go to step S301, else, go to step S303. In step S302, the accumulated fetched bit number is obtained by accumulating the bit number of the decoded data of the data frame.

For example, assuming that 5 codewords A1, A2, A3, A4 and A5 are included in the data frame, the corresponding data bit number (in the unit of byte) are 2, 3, 4, 3 and 2, respectively. Usually, the decoding process for the data frame is based on the order of codewords. That is, A1 is decoded before A2, A2 is decoded before A3, and so on. The decoding operation continues till the data frame is completely decoded. Under a normal decoding condition, assuming that A2 is decoded, the corresponding accumulated fetched bit number is the sum of data bit numbers of A1 and A2, i.e. 5 bytes; further, assuming that A3 is decoded, the corresponding accumulated fetched bit number is the sum of data bit numbers of A1, A2 and A3, i.e. 9 bytes.

In the following, a detailed operation process of determining whether the accumulated fetched bit number is within a length range of the data frame according to the length information of the data frame will be described.

The length information of the data frames may be derived from the information provided by the headers of the data frames or the specification of the data frames, or may be derived from other information transmitted to the decoder. In this embodiment, the obtained length of data frames is 2+3+4+3+2, i.e. 14 bytes.

Assume that the byte position after decoding A4 is the 15$^{th}$ byte of the data frame, that is, the accumulated fetched bit number is 15 bytes. The accumulated fetched bit number (15 bytes) is greater than the length information (14 bytes). Hence, it can be determined that the corresponding accumulated fetched bit number obtained after A4 is decoded is greater than the length of the data frame (i.e. the accumulated fetched bit number obtained when A4 is decoded is not within the length range), which means the data frame is erroneous.

Assume that the byte position after decoding A5, the last data to be decoded, is the 12$^{th}$ byte of the data frame, that is, the accumulated fetched bit number is 12 bytes. The accumulated fetched bit number (12 bytes) is less than the length information (14 bytes). Hence, it can be determined that the corresponding accumulated fetched bit number obtained after A5 is decoded is less than the length of the data frame (i.e. the accumulated fetched bit number obtained when A5 is decoded is not within the length range), which means the data frame is erroneous.

Step S303: Perform an error handling process upon the data frame. In step S303, the error handling process includes discarding the erroneous data frame of the code stream, or muting the output of the erroneous data frame of the code stream.

By employing the aforementioned method, the error detection method of the VLC code stream determines whether the accumulated fetched bit number is within a length range of the data frame on the basis of length information of the data frames according to the second embodiment of the present invention. Specifically speaking, when the accumulated fetched bit number exceeds length information of the data frame but the decoding process of the data frame is not completed, or when the accumulated fetched bit number is less than the length information of the data frame and the decoding process of the data frame is completed, an error of the data frame is asserted. Therefore, the objective of obtaining error detection results of the data frames before CRC process to thereby prevent the normal system operation from being affected by data frame errors is achieved.

Figure 8:
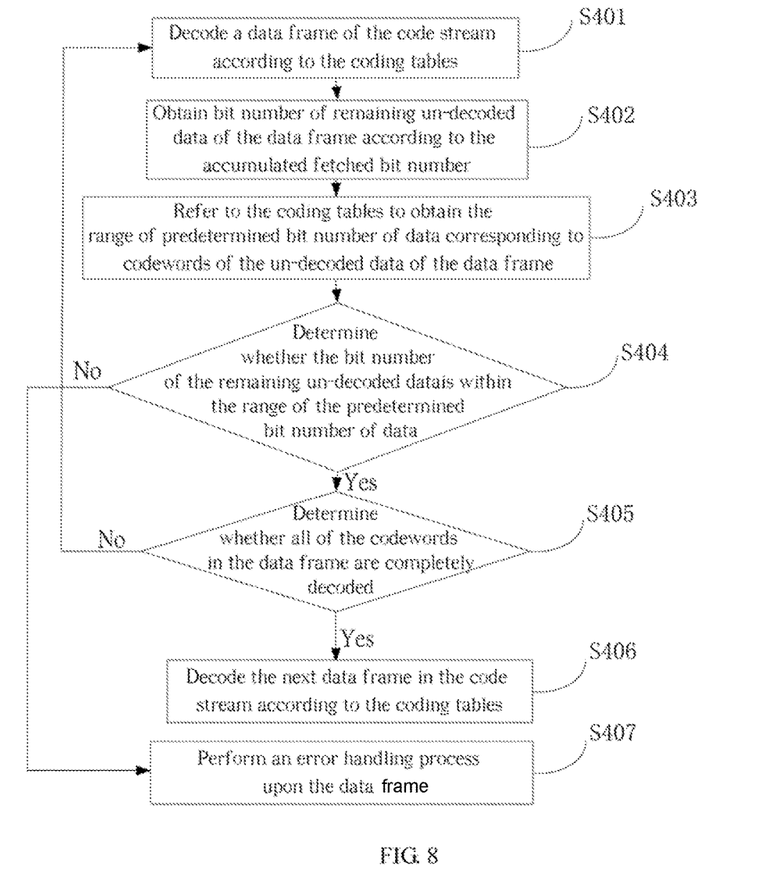
FIG. 8 is a flowchart illustrating an error detection method of a VLC code stream according to a third embodiment of the present invention.

FIG. 8 is a flowchart illustrating an error detection method of a VLC code stream according to a third embodiment of the present invention. Provided that substantially the same result is achieved, the steps of the flowchart shown in FIG. 8 need not be in the exact order shown and need not be contiguous. The method shown in FIG. 8 may be briefly summarized as follows.

Step S401: Decode a data frame of the code stream according to the coding tables.

Step S402: Obtain bit number of remaining un-decoded data of the data frame according to the accumulated fetched bit number. In step S402, the bit number of the remaining un-decoded data of the data frame is derived according to the length information and the accumulated fetched bit number, wherein the accumulated fetched bit number is obtained by accumulating the bit number of the decoded data of the data frame.

Figure 12:
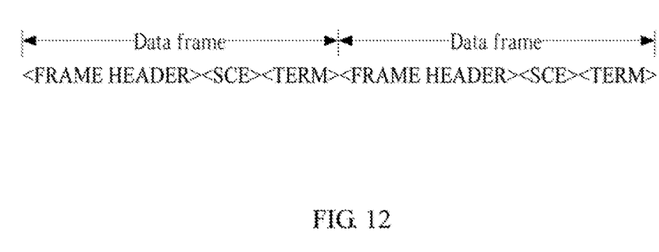
FIG. 12 is a diagram illustrating the structure of an AAC single channel code stream.

For example, the structure of an AAC single channel code stream is shown in FIG. 12, and the structure of a data frame is shown in Table 2.

TABLE 2

| FRAME HEADER | | SCE | | TERM |
|---|---|---|---|---|
| Syncword | AAC_Frame_Length | Ics_info | Section_Data SFB | 0X07 |

As shown in FIG. 12, the data frame includes a frame header, a single channel element (SCE) and a terminator (TERM). Specifically speaking, please also refer to table 2, the frame header includes a 12-bit syncword "1111_1111_1111" and a 13-bit AAC_frame_length. The SCE includes independent channel stream information (Ics_info) and scale factor band (SFB) information. The SFB information is encoded by Huffman VLC, and each SFB information is a codeword. The SFB information is located at the end of a data frame. The TERM is fixed to 0X07 for indicating the end of one data frame.

In the course of decoding the data frames, the length of data frame can be obtained by reading the AAC_frame_length. The length is the overall length of the data frame and can be understood as the sum of other data length and SFB information data length, where the other data length is the sum of the header length, the Ics_info length, etc.

It is assumed that the data frame length read from the AAC_frame_length is 163 bytes, and the amount of the transmitted SFB information (MAX_SFB) read from the Ics_info is 36.

During the frame decoding process, when the first SFB is completely decoded, and the current decoding position at this moment is the 120$^{th}$ byte of the data frame (i.e. the accumulated fetched bit number is 120 bytes minus other data length), the remaining data bit number RENAIN_BITS of un-decoded data in the data frame equals SFB information length minus the accumulated fetched bit number. According to the structure mentioned above, the SFB information length=163 bytes−other data length. Hence the remaining data bit number of un-decoded data in the data frame is expressed as below: RENAIN_BITS=SFB information length−the accumulated fetched bit number=163−120=43 bytes.

Step S403: Refer to the coding tables to obtain the range of predetermined bit number of data corresponding to codewords of the un-decoded data of the data frame. In step S403, first of all, the ranges of the corresponding codeword lengths indicated in the coding tables for the remaining un-decoded codewords of the data frame are derived respectively; next, the range of predetermined bit number of data corresponding to codewords of the un-decoded data of the data frame is obtained according to the codeword ranges, wherein the range of the predetermined bit number of the data corresponds to an accumulated summing number of the ranges of the codeword lengths in the coding tables that are used by the codewords of the un-decoded data.

For example, the SCE of the AAC single channel code stream includes section_data, and the coding table information utilized by each SFB information of the SCE can be obtained from the section_data. Specifically speaking, the coding table information corresponding to the un-decoded codeword can be derived from the section_data. For instance, it can be known from the section_data that the coding tables used by the $2^{nd}$-$36^{th}$ SFB are: the coding table 6 used by the $2^{nd}$-$14^{th}$ SFB, the coding table 4 used by the $15^{th}$-$27^{th}$ SFB, and the coding table 2 used by the $28^{th}$-$36^{th}$ SFB. For example, the range of codeword lengths of the coding table 6 is a range of 4 bits to 11 bits, the range of codeword lengths of the coding table 4 is a range of 4 bits to 11 bits, and the range of codeword lengths of the coding table 2 is a range of 3 bits to 9 bits.

The maxima of range of predetermined bit number of data, MAX_BITS is the accumulated summing number of the maximum codeword lengths of the coding tables used by the $2^{nd}$-$36^{th}$ SFB. When the codeword lengths for the $2^{nd}$-$14^{th}$ SFB (13 in total) are 11 bits, the codeword lengths for the $15^{th}$-$27^{th}$ SFB (13 in total) are 11 bits, and codeword lengths for the $28^{th}$-$36^{th}$ SFB (9 in total) are 9 bits, the maximum codeword range MAX_BITS=11*13+11*13+9*9=367 bits.

The minimum of the range of predetermined bit number of data MIN_BITS is the accumulated summing number of the minimum codeword lengths of the coding tables used by the $2^{nd}$-$36^{th}$ SFB. When the codeword lengths of the $2^{nd}$-$14^{th}$ SFB are 4 bits, the codeword lengths of the $15^{th}$-$27^{th}$ SFB are 4 bits, and the codeword lengths for the $28^{th}$-$36^{th}$ SFB are 3 bits, the minimum codeword range MIN_BITS=4*13+4*13+3*9=131 bits.

Step S404: Determine whether the bit number of the remaining un-decoded data is within the range of the predetermined bit number of data. If the bit number of the remaining un-decoded data is within the range of the predetermined bit number of data, step S405 will be performed; and if the bit number of the remaining un-decoded data is not within the range of the predetermined bit number of data, step S407 will be performed.

Taking the AAC single channel code stream for example, when the first SFB is decoded and the remaining data bit number is 43 bytes, i.e. 344 bits, the range of predetermined data bit number is greater than 131 bits and less than or equal to 367 bits. Since 344 bits is within the range of 131 bits to 367 bits, which means that after the first SFB is decoded, the bit number of the remaining un-decoded data is within the range of the predetermined bit number of data. Accordingly, the step S405 is performed next.

Assuming that when the first SFB is decoded and the decoding position is the $116^{th}$ byte of the data frame, the remaining data bit number=163−116=47 bytes, i.e. 374 bits, which is greater than the upper limit of the predetermined bit number of data, 367 bits. This means that after the first SFB is decoded, the bit number of the remaining un-decoded data is not within the range of the predetermined bit number of data. Accordingly, the step S407 is performed next.

Step S405: Determine whether all of the codewords in the data frame are completely decoded. If not, go to step S401; else go to step S406. In step S405, the maximum serial number of the decoded codeword and the total number of the codeword of the data frame can be compared with each other to determine whether these two numbers are equal. If not, it means that not all of the codewords in the data frame are completely decoded, and the flow proceeds with step S401; if yes, it means that all of the codewords of the data frame are completely decoded, and the flow proceeds with step S406.

Taking the AAC single channel code stream for example, when the $20^{th}$ SFB is decoded, the maximum serial number of the decoded codeword is 20, which is less than MAX_SFB 36. Hence, the decoding process should be continued for the $21^{st}$ SFB. When the $36^{th}$ SFB is decoded, the maximum serial number of the decoded codeword is 36, which equals MAX_SFB, i.e. 36. Hence, the decoding process of the data frame is completed, and the decoding process should be continued for the next data frame in the code stream.

Step S406: Decode the next data frame in the code stream according to the coding tables;

Step S407: Perform an error handling process upon the data frame. In step S407, after the error handling process is performed upon the data frame, an initial position of the data frame immediately following the erroneous data frame can be confirmed through finding the frame synchronization header, and then the decoding process can be performed upon the following data frame for deriving the original data.

By employing the aforementioned method, the error detection method of the VLC code stream determines whether the bit number of the remaining un-decoded data is within the range of the predetermined bit number of data according to the third embodiment of the present invention. Therefore, bit reversing or other transmission error happens to the data frame of the code stream during transmission can be detected, thereby preventing the normal system operation from being affected by data frame errors.

Figure 9:
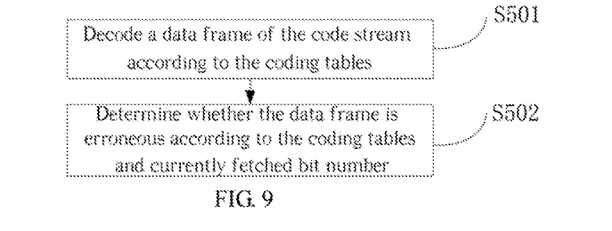
FIG. 9 is a flowchart illustrating an error detection method of a VLC code stream according to a fourth embodiment of the present invention.

FIG. 9 is a flowchart illustrating an error detection method of a VLC code stream according to a fourth embodiment of the present invention. Provided that substantially the same result is achieved, the steps of the flowchart shown in FIG. 9 need not be in the exact order shown and need not be contiguous. The method shown in FIG. 9 may be briefly summarized as follows:

Step S501: Decode a data frame of the code stream according to the coding tables. In this embodiment, step S501 is similar to step S401 of FIG. 8, and the details are omitted here for brevity.

Step S502: Determine whether the data frame is erroneous according to the coding tables and currently fetched bit number. In step S502, the range of codeword lengths corresponding to the currently fetched bit number is obtained from the coding tables, and it is determined that whether the currently fetched bit number is within the range of the codeword lengths. When the currently fetched bit number is not within the range of the codeword lengths, the error handling process will be performed upon the data frame.

The currently fetched bit number is the number of fetched bits corresponding to the codeword being decoded currently. In an embedded system, the coding tables are usually stored in a static random access memory (SRAM) or a dynamic random access memory (DRAM), and are addressed along with other system data. Those persons skilled in the art should readily understand that the contents of the storage units of the SRAM or DRAM can be accessed arbitrarily. If decoding errors or other abnormal situations occur in the course of the decoding process, the contents of the coding tables may be modified or overwritten while accessing the storage units of the SRAM or DRAM, thus leading to the case that the currently fetched bit number is not within the range of codeword lengths.

For instance, assuming 6 codewords $a_1$, $a_2$, $a_3$, $a_4$, $a_5$ and $a_6$ existing in the coding table are 10, 11, 000, 001, 010, 0110, it can be seen that the range of codeword lengths of the current coding table is 2 bits to 4 bits. During the decoding process, if the codeword $a_1$ in the coding table is modified to 11011, the codeword $a_2$ in the coding table is modified to 10, and the code stream needed to be decoded is 1101101011, then the decoded source symbol of the first codeword is $a_1$ and the currently fetched bit number corresponding to the first codeword will be 5 bits according to the coding table, i.e. 11011, which is greater than the maximum codeword length, 4 bits, of the current coding table. This indicates that the currently fetched number is not within the range of codeword length of the coding table. Therefore, it is determined that error occurs during the data frame decoding process, and thus the error handling process will be performed.

In this embodiment, the error handling process may be an operation of re-initializing the coding tables stored in the memory for guaranteeing the correctness of the decoding of the following data frames.

By employing the aforementioned method, the error detection method of the VLC code stream determines whether the data frame is erroneous based on the coding tables and the currently fetched bit number according to the fourth embodiment of the present invention. Therefore, data frame errors introduced by variation of the coding tables stored in the RAM can be detected, thereby preventing the normal system operation from being affected by data frame errors.

Figure 10:
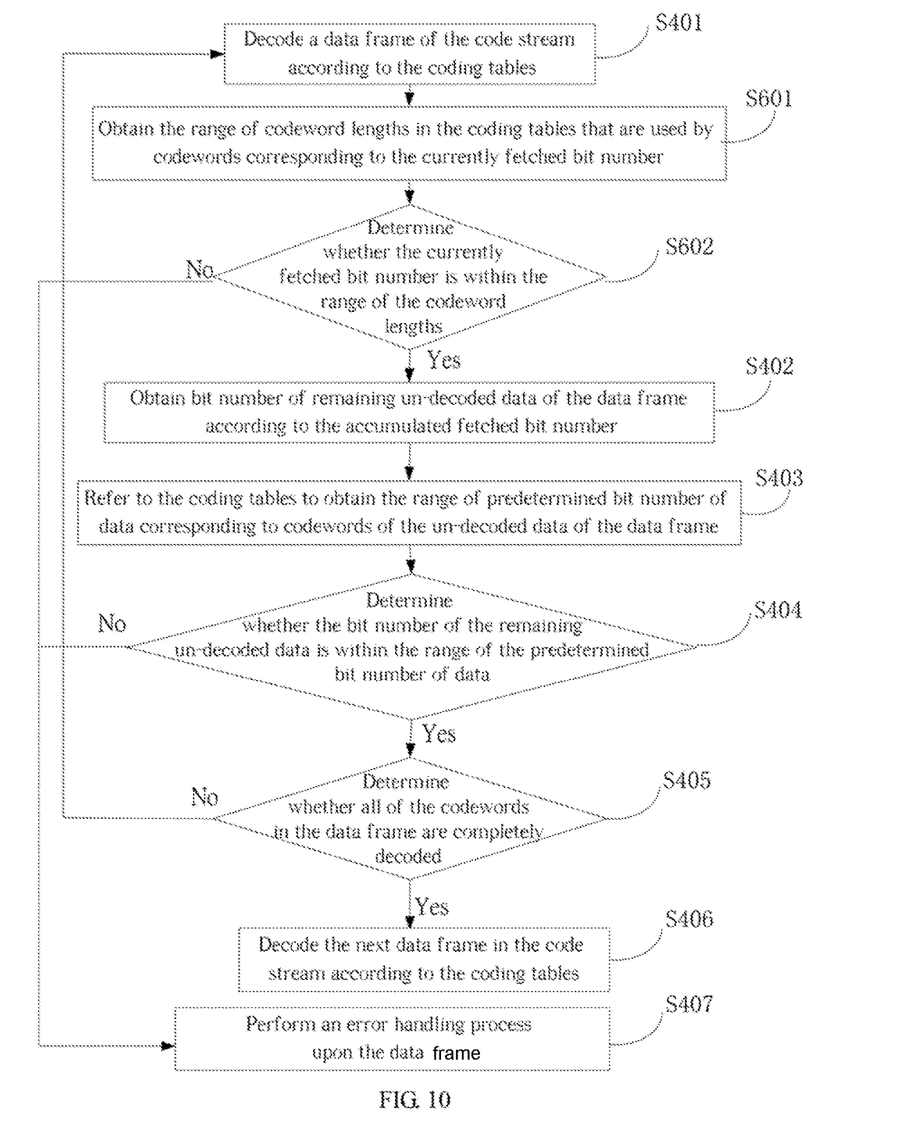
FIG. 10 is a flowchart illustrating an error detection method of a VLC code stream according to a fifth embodiment of the present invention.

FIG. 10 is a flowchart illustrating an error detection method of a VLC code stream according to a fifth embodiment of the present invention. Provided that substantially the same result is achieved, the steps of the flowchart shown in FIG. 10 need not be in the exact order shown and need not be contiguous.

As shown in FIG. 10, the main difference between the fifth embodiment shown in FIG. 10 and the third embodiment shown in FIG. 8 is that FIG. 10 further includes steps S601 and S602 after step S401. The details of steps S601 and S602 are described as follows.

Step S601: Obtain the range of codeword lengths in the coding tables that are used by codewords corresponding to the currently fetched bit number.

Specifically speaking, on the basis of the embodiment of FIG. 8, after step S401 is executed, the range of codeword lengths corresponding to the currently decoded codeword is obtained, that is, the range of codeword lengths possessed by the currently decoded codeword is obtained.

Step S602: Determine whether the currently fetched bit number is within the range of the codeword lengths. If the currently fetched bit number is within the range of the codeword lengths, the flow goes to step S402; and when the currently fetched bit number is not within the range of codeword lengths, the flow goes to step S407. In step S602, when the currently fetched bit number is within the range of codeword lengths, it will be understood that the decoding process of the current codeword of the data frame is normal; and when the currently fetched bit number is not within the range of the codeword length, it will be understood that the decoding process of the current codeword of the data frame is erroneous.

All of the other steps included in the flowchart shown in FIG. 10 have been disclosed in FIG. 8. Therefore, the details are omitted here for brevity. By employing the aforementioned method, the error detection method of the VLC code stream firstly detects whether an error occurs in the data frame by determining whether the currently fetched bit number is within the range of codeword lengths, and then further detecting whether an error occurs in the data frame by determining whether the remaining un-decoded data bit number is within the range of predetermined data bit number. Therefore, bit reversing or other transmission error happens to the data of code stream during transmission as well as data frame errors introduced by variation of the coding tables stored in the RAM can be detected, thereby preventing the normal system operation from being affected by data frame errors.

Figure 11:
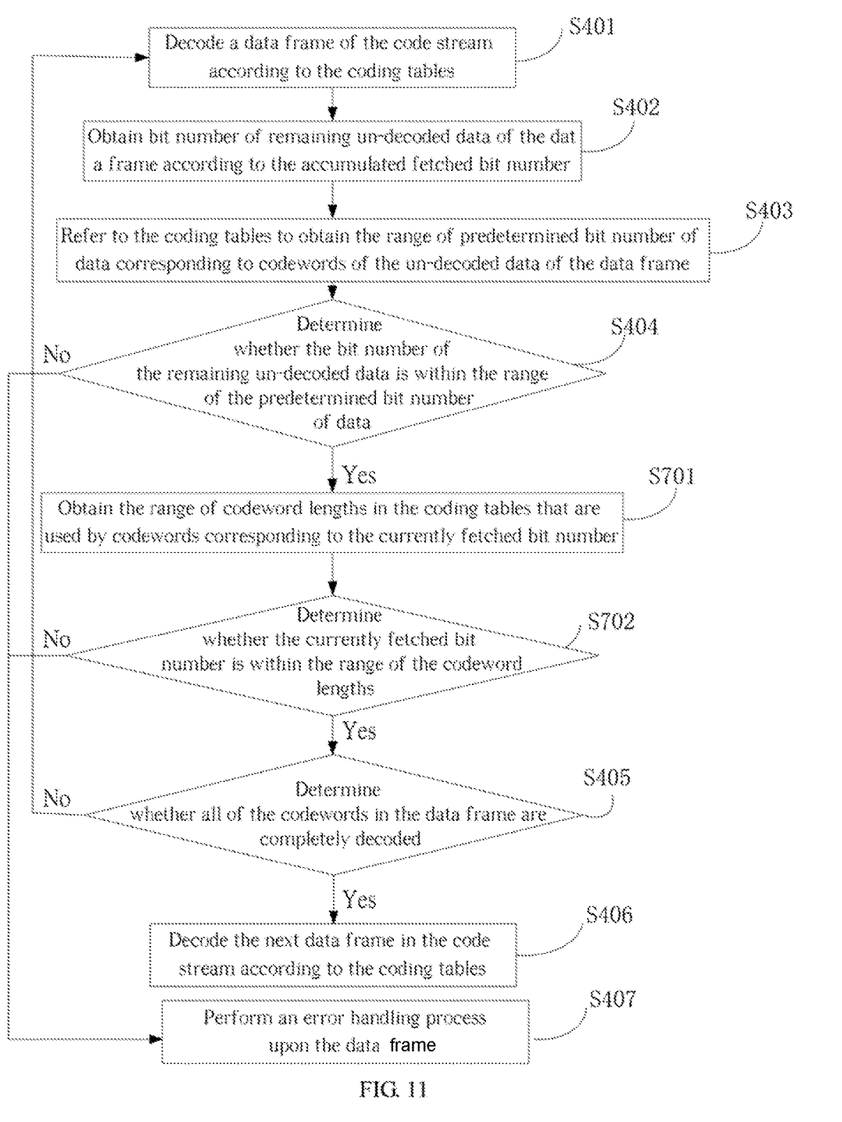
FIG. 11 is a flowchart illustrating an error detection method of a VLC code stream according to a sixth embodiment of the present invention.

FIG. 11 is a flowchart illustrating an error detection method of a VLC code stream according to a sixth embodiment of the present invention. Provided that substantially the same result is achieved, the steps of the flowchart shown in FIG. 11 need not be in the exact order shown and need not be contiguous.

As shown in FIG. 11, the main difference between the sixth embodiment shown in FIG. 11 and the third embodiment shown in FIG. 8 is that FIG. 11 further includes steps S701 and S702 after step S404. Steps S701 and S702 of the flowchart shown in FIG. 11 are similar to steps S601 and S602 shown in FIG. 10. All of the other steps included in the flowchart shown in FIG. 11 have been disclosed in FIG. 8. Therefore, the details are omitted here for brevity.

By employing the aforementioned method, the error detection method of the VLC code stream firstly detects whether an error occurs in the data frame by determining whether the bit number of the remaining un-decoded data is within the range of the predetermined bit number of data, and then further detecting whether an error occurs in the data frame by determining whether the currently fetched bit number is within the range of codeword lengths. Therefore, bit reversing or other transmission error happens to the data of the code stream during transmission as well as data frame errors introduced by variation of the coding tables stored in the RAM can be detected, thereby preventing the normal system operation from being affected by data frame errors.

The above is only embodiments of the present invention, and is not a limitation of the present invention patent. Any equivalent structure or process transformation, or directly or indirectly application in other technical fields made by use of the contents of the specification and drawings of the present invention all equivalently fall within the scope of present invention.

What is claimed is:

1. An error detection method of a variable-length coding (VLC) code stream, comprising:
   decoding a data frame of the VLC code stream by a decoder, comprising:
   decoding the data frame according to coding tables; wherein an accumulated fetched bit number is obtained by accumulating a bit number of the decoded data of the data frame; and
   determining whether the data frame is erroneous according to length information of the data frame and the accumulated fetched bit number of the data frame by a determining module, comprising:
   obtaining a bit number of remaining un-decoded data of the data frame according to the accumulated fetched bit number;
   obtaining a range of predetermined bit number of data corresponding to codewords of the un-decoded data of the data frame according to the coding tables;
   determining whether the bit number of the remaining un-decoded data is within the range of the predetermined bit number of data; and when the bit number of the remaining un-decoded data is not within the range of the predetermined bit number of data, performing an error handling process upon the data frame.

2. The error detection method of the VLC code stream of claim 1, wherein the step of determining whether the data frame is erroneous according to the length information of the data frame and an accumulated fetched bit number of the data frame comprises:

determining whether the accumulated fetched bit number is within a length range indicated by the length information; and when the accumulated fetched bit number is not within the length range, performing an error handling process upon the data frame.

3. The error detection method of the VLC code stream of claim 1, wherein the step of obtaining the bit number of the remaining un-decoded data of the data frame according to the accumulated fetched bit number comprises:

obtaining the bit number of the remaining un-decoded data of the data frame according to the length information and the accumulated fetched bit number.

4. The error detection method of the VLC code stream of claim 3, wherein the step of obtaining the range of the predetermined bit number of the data corresponding to the codewords of the un-decoded data of the data frame according to the coding tables comprises:

obtaining ranges of codeword lengths in the coding tables that are used by the codewords of the un-decoded data of the data frame, respectively; and obtaining the range of the predetermined bit number of the data corresponding to the codewords of the un-decoded data of the data frame according to the ranges of the codeword lengths in the coding tables that are used by the codewords of the un-decoded data;

wherein the range of the predetermined bit number of the data corresponds to an accumulated summing number of the ranges of the codeword lengths in the coding tables that are used by the codewords of the un-decoded data.

5. The error detection method of VLC code stream of claim 1, wherein the accumulated fetched bit number further comprises a currently fetched bit number, and the method further comprises:

obtaining a range of codeword lengths of codewords in the coding tables that correspond to the currently fetched bit number;

determining whether the currently fetched bit number is within the range of codeword lengths; and when the currently fetched bit number is not within the range of codeword lengths, performing an error handling process upon the data frame.

6. The error detection method of the VLC code stream of claim 1, further comprising:

when the bit number of the remaining un-decoded data is within the range of the predetermined bit number of data, further determining whether all codewords in the data frame are completely decoded; and when not all codewords in the data frame are completely decoded, decoding the data frame according to the coding tables.

7. A decoding and error detection apparatus, comprising:
a decoding module for decoding the data frame according to coding tables;
a first determining module, coupled to the decoding module, comprising:

a remaining bit number deriving unit, arranged for obtaining a bit number of remaining un-decoded data of the data frame according to the accumulated fetched bit number;

a predetermined bit number range deriving unit, arranged for referring to the coding tables to obtain a range of predetermined bit number of data corresponding to codewords of the un-decoded data of the data frame;

a first determining unit, arranged for determining whether the bit number of the remaining un-decoded data is within the range of the predetermined bit number of data: wherein when the bit number of the remaining un-decoded data is not within the range of the predetermined bit number of data, an error handling module performs the error handling process upon the data frame; and the error handling module, coupling to the first determining module, wherein when the decoding module decodes a data frame of a code stream, the first determining module determines whether the data frame is erroneous according to length information of the data frame and an accumulated fetched bit number of the data frame obtained by accumulating the bit number of the decoded data of the data frame, and when the first determining module determines that the data frame is erroneous, the error handling module performs an error handling process upon the data frame.

8. The decoding and error detection apparatus of claim 7, wherein the first determining module determines whether the accumulated fetched bit number is within a length range indicated by the length information; and when the accumulated fetched bit number is not within the length range, the error handling module performs the error handling process upon the data frame.

9. The decoding and error detection apparatus of claim 7, wherein the remaining bit number deriving unit obtains the bit number of the remaining un-decoded data of the data frame according to the length information and the accumulated fetched bit number.

10. The decoding and error detection apparatus of claim 9, wherein the predetermined bit number range deriving unit obtains ranges of codeword lengths in the coding tables that are used by the codewords of the un-decoded data of the data frame, respectively; obtains the range of the predetermined bit number of the data corresponding to the codewords of the un-decoded data of the data frame according to the ranges of the codeword lengths in the coding tables that are used by the codewords of the un-decoded data; wherein the range of the predetermined bit number of the data corresponds to an accumulated summing number of the ranges of the codeword length in the coding tables that are used by the codewords of the un-decoded data.

11. The decoding and error detection apparatus of claim 7, wherein the accumulated fetched bit number further comprises a currently fetched bit number, and the first determining module further comprises:

a codeword length range deriving unit, arranged for obtaining a range of codeword lengths of codewords in the coding tables that correspond to the currently fetched bit number; and a second determining unit, arranged for determining whether the currently fetched bit number is within the range of the codeword lengths;

wherein when second determining unit determines the currently fetched bit number is not within the range of the codeword lengths, the error handling module performs the error handling process upon the data frame.

12. The decoding and error detection apparatus of claim 7, further comprising:
- a second determining module, wherein when the first determining unit determines that the bit number of the remaining un-decoded data is within the range of the predetermined bit number of data, the second determining module determines whether all codewords in the data frame are completely decoded;
- wherein when the second determining module determines that not all codewords in the data frame are completely decoded, the decoding module decodes the data frame according to the coding tables.

\* \* \* \* \*